(12) United States Patent
Thrasher et al.

(10) Patent No.: US 10,466,280 B1
(45) Date of Patent: Nov. 5, 2019

(54) ENHANCED CIRCUIT AND METHOD FOR DETECTING HAZARDOUS FOREIGN VOLTAGES ON CONDUCTORS

(71) Applicant: Power Solutions, Inc., Warrior, AL (US)

(72) Inventors: Mel Thrasher, Warrior, AL (US); Brandon Thrasher, Warrior, AL (US)

(73) Assignee: Power Solutions, Inc., Warrior, AL (US)

( * ) Notice: Subject to any disclaimer, the term of this patent is extended or adjusted under 35 U.S.C. 154(b) by 54 days.

(21) Appl. No.: 15/963,593

(22) Filed: Apr. 26, 2018

Related U.S. Application Data (60) Provisional application No. 62/657,210, filed on Apr. 13, 2018.

(51) Int. Cl.
| | |
|---|---|
| *G01R 19/155* | (2006.01) |
| *G01R 1/067* | (2006.01) |
| *G01R 19/165* | (2006.01) |
| *G01R 19/25* | (2006.01) |
| *G01R 15/16* | (2006.01) |

(52) U.S. Cl.
CPC ....... *G01R 19/155* (2013.01); *G01R 1/06788* (2013.01); *G01R 15/16* (2013.01); *G01R 19/16561* (2013.01); *G01R 19/16576* (2013.01); *G01R 19/2513* (2013.01); *G01R 19/2516* (2013.01)

(58) Field of Classification Search
CPC ..... G01R 19/165; G01R 19/155; G01F 23/26; G01F 23/22; G01F 23/284; A61B 5/0534; A61C 8/0089; A61C 19/04
USPC ... 324/713–715, 72, 72.5, 750.01, 500, 507, 324/513, 523, 750.15–750.22, 754.19, 324/756.01, 762.01, 600, 612, 76.11, 324/425–433, 522, 239
See application file for complete search history.

(56) References Cited

U.S. PATENT DOCUMENTS

| | | |
|---|---|---|
| 1,152,632 A | 9/1915 | Hogan, Jr. |
| 1,799,683 A | 4/1931 | Geiger |
| 1,836,934 A | 12/1931 | Morecroft |
| 1,895,812 A | 1/1933 | Morecroft |

(Continued)

*Primary Examiner* — Melissa J Koval
*Assistant Examiner* — Trung Nguyen
(74) *Attorney, Agent, or Firm* — Womble Bond Dickinson (US) LLP (57) ABSTRACT

A method of detecting the presence of a hazardous foreign voltage on a conductor includes the steps of sensing an electric field in the vicinity of the conductor with a first non-contact conductive sensor and sensing the electric field in the vicinity of the conductor with a second non-contact conductive sensor spaced a predetermined distance from the first non-contact conductive sensor. The difference between the electric field sensed by the first conductive sensor and the electric field sensed by the second conductive sensor is determined. The first conductive sensor preferably is shaped as a truncated spheroid. If the difference is less than a predetermined threshold, the sensed electric field is ignored as being induced by a distant source. If the difference is greater than a predetermined threshold, the electric field sensed by the first and second conductive sensors is considered to be indicative of the presence of a foreign voltage on the conductor. In that event, at least one alarm is activated as an alert to the presence of a foreign voltage on the conductor.

14 Claims, 5 Drawing Sheets

(56) References Cited

U.S. PATENT DOCUMENTS

| | | |
|---|---|---|
| 2,140,016 A | 12/1938 | Kautter |
| 2,615,969 A | 10/1952 | Albrecht |
| 3,309,690 A | 3/1967 | Moffitt |
| 3,482,235 A | 12/1969 | Johnson |
| D222,138 S | 10/1971 | Palmer et al. |
| 3,742,351 A | 6/1973 | Palmer |
| 3,786,468 A | 1/1974 | Moffitt |
| 3,828,256 A | 8/1974 | Liu |
| 3,934,195 A | 1/1976 | Shires |
| 4,123,009 A | 10/1978 | Kilpinen |
| D251,184 S | 2/1979 | Volk |
| 4,349,783 A | 9/1982 | Robson et al. |
| 4,613,228 A | 9/1986 | Suzuki et al. |
| 4,716,371 A | 12/1987 | Blitshteyn et al. |
| 4,724,393 A | 2/1988 | Kumada et al. |
| 4,797,620 A | 1/1989 | Williams |
| 4,804,922 A | 2/1989 | Sometani et al. |
| 4,818,945 A | 4/1989 | Bossard |
| 4,853,639 A | 8/1989 | Vosteen et al. |
| 4,983,954 A | 1/1991 | Huston |
| 5,001,465 A | 3/1991 | Siegel |
| 5,315,255 A | 5/1994 | Bettinger |
| 5,325,047 A | 6/1994 | Kempton |
| 5,350,999 A | 9/1994 | Brunda |
| 5,414,344 A | 5/1995 | Chinn |
| 5,473,244 A | 12/1995 | Libove et al. |
| D367,431 S | 2/1996 | Omuro |
| D371,747 S | 7/1996 | Strader |
| 5,604,436 A | 2/1997 | Henritzy |
| 5,703,928 A | 12/1997 | Galloway et al. |
| 5,952,820 A | 9/1999 | Thrasher et al. |
| 6,828,767 B2 | 12/2004 | Douglas |
| D625,211 S | 10/2010 | Chun |
| 7,948,227 B2 | 5/2011 | Beckmann |
| 8,193,802 B2 * | 6/2012 | Jones ..................... F21L 4/027 324/72.5 |
| D738,241 S | 9/2015 | Payne |
| 10,073,142 B2 * | 9/2018 | Kuhn ................. G01R 1/06788 |

* cited by examiner

ENHANCED CIRCUIT AND METHOD FOR DETECTING HAZARDOUS FOREIGN VOLTAGES ON CONDUCTORS

TECHNICAL FIELD

The invention disclosed herein relates generally to non-contact voltage detection and more particularly to detection by utility linemen, telephone system installers, and others of the presence of a potentially dangerous alternating voltage on conducting surfaces such as transmission lines, telephone wires, metal utility boxes, metal house trailers, and the like prior to coming into contact with the conducting surfaces.

BACKGROUND

Electrical utility workers, telephone linemen, appliance installation teams, and other types of workers often find themselves working among or near electrical conductors that could potentially carry large dangerous alternating voltages. Electrical utility workers and telephone linemen, for example, often ply their trades near high voltage power lines. Even in situations where these individuals are not working directly in the vicinity of power lines, they nevertheless find themselves working on or with other electrical conductors that can be charged with potentially dangerous alternating voltages. These may include, for example, electrical and telephone junction boxes, power distribution stations, circuit breaker panels, and even the metal exterior skin of house trailers and other metal buildings. These conductors can become electrified through unintended contact with electrical lines, and the contact may be local or miles away down a telephone line or cable. It is extremely important that such workers be able to determine whether conductors and conducting surfaces are charged with potentially dangerous voltages before working on or coming into contact with the conductors. Failure to do so can result in electrocution and instant death when a worker touches a charged conductor.

One method of determining whether a conductor is carrying a dangerous alternating voltage is simply to measure the voltage directly with a voltmeter connected between the conductor and ground. While this method indeed gives an accurate measurement of voltages present on the conductor, it is nevertheless dangerous and highly undesirable, particularly when measuring alternating voltages greater than about 150 volts RMS. This is because direct contact is required between the voltmeter probe and the conductor. Further, in many situations, such as with electrical power lines, the conductor may be covered with an insulator so that direct contact with a voltmeter probe is not practical.

Attempts to design voltage detectors that detect the presence of a dangerous alternating voltage on a conductor without actually contacting the conductor have been made. U.S. Pat. No. 5,414,344 of Chinn, for example, discloses a non-contact apparatus for sensing energization of high voltage signal lines. Other prior attempts are disclosed, for example, in U.S. Pat. No. 4,818,945 of Bossard and U.S. Pat. No. 5,325,047 of Kempton. The devices and methods disclosed in these prior art patents are plagued with respective problems and shortcomings for use by linemen and others in the field.

Devices such as those disclosed in the above patents fail to meet the needs of telephone line workers wishing to detect the presence of dangerous alternating voltages. For example, none of them address an issue of particular interest to electric utility workers and telephone linemen; that is, the ability to detect potentially dangerous alternating voltages on a conductor while ignoring the presence of known benign voltages. Potentially dangerous alternating voltage usually has a primary frequency of 60 hertz and harmonics up to about 180 hertz. Alternating voltages with frequencies above about 200 hertz are usually not dangerous but nevertheless can be induced in conductors and conducting surfaces by radio transmitter signals, microwave signals, and other ambient transmissions. These higher frequency signals can affect voltage detectors by corrupting their measurements or producing a false alarm. False alarms, in turn, can postpone needed work and cost money while it is determined whether a dangerous alternating voltage is in fact present on a conducting surface to be serviced.

Another benign signal commonly present in telephone circuits is the telephone ring signal. The predominant ring signal used in the United States telecommunications industry is a 20 hertz sine wave signal at about 85 to 105 volts RMS. While such a signal is common, it is nevertheless not considered dangerous by linemen and utility workers. However, detection of such a signal by a voltage detector can corrupt a measurement or indicate the presence of a dangerous condition when, in fact, no dangerous condition exists; i.e., generate a false alarm.

U.S. Pat. No. 5,952,820, owned by the assignee of the present application, is directed to a foreign voltage detector that is an improvement over those of the prior art at the time of its filing. The patent discloses a foreign voltage detector designed to detect and warn of the presence of potentially dangerous alternating voltage levels on conductors such as telephone lines and power cables, metal utility boxes, metal building frames, and other conductors. The detector comprises a capacitive leaf sensor that is charged through capacitive coupling when brought near a conductor carrying an alternating voltage. The charge is converted to a voltage signal that is low pass filtered and notch filtered to remove extraneous signals and telephone ring signals. The filtered voltage signal is then converted to DC, and drives a ten element LED bar graph display to indicate the approximate level an alternating voltage detected on the conductor. A buzzer is provided as an audible alarm of the presence of potentially dangerous voltage. Low pass filters and notch filters are employed to reject signals above a given frequency and also to reject signals at and around the common frequency of telephone ring signals. As a result, a reliable detection of dangerous alternating voltages is provided with fewer false alarms caused by benign voltages.

While the foreign voltage detector of the '820 patent proved successful as a commercial product, certain shortcomings became apparent over time. For example, the circuitry of my prior detector was completely analog, which proved rather expensive to manufacture and also not easily adaptable to changes. Perhaps more importantly, however, it became clear over time that the detector of the '820 patent was susceptible to false alarms that could be triggered by electric fields generated by distant high power transmission lines, when in fact the conducting surface to be worked on carried no dangerous voltage. Also, when using the detector of the '820 patent in confined spaces where it was not readily visible, or in noisy environments, or in at least one case, by a deaf lineman, the visual and audible alarms provided by the detector could not always be seen or heard by a worker.

There exists a need for an improved method and apparatus for detecting and indicating to a worker the presence on electrical conductors of potentially dangerous alternating voltages. Such a method and apparatus should effectively filter out the presence of electrical signals having frequencies above about 200 hertz to filter out stray signals caused, for example, by radio transmitters. Furthermore, such a detector should filter out accurately and effectively signals produced at about 20 hertz that correspond to telephone ring signals so that these signals will not corrupt measurements or produce a false alarm. The improved method and apparatus should be immune to false alarms caused by distant high power transmission lines, should be highly adaptable to changing performance requirements, and should be configured as a small handheld device that can be carried by utility workers and linemen. The apparatus should be convenient, reliable, accurate, and should be economical and feasible to produce in large quantities. It is to the provision of such a method and apparatus that the present invention is primarily directed.

SUMMARY

Briefly described, an improved foreign voltage detection method and apparatus is disclosed for use by telephone linemen, utility workers, appliance installation teams, and other workers to detect the presence of dangerous alternating voltages on wires, metal boxes, and other conductors before being touched by the worker. The apparatus comprises a hand-held probe having a tip that houses two sensors for sensing alternating electric fields. The first sensor is a conductive element in the end of the tip and the second sensor is a conducting element spaced a predetermined distance behind the first sensor. In a preferred embodiment, the first sensor is a conductive ball and the second sensor is a conductive sleeve. These configurations are not limiting, however, and the invention includes sensors of any appropriately functional shape. In the preferred embodiment, the ball and sleeve are connected to corresponding inputs of an instrument amplifier that is configured as a difference amplifier. The difference amplifier passes a signal that is the amplified difference between the small voltages induced in the ball and the sleeve respectively through capacitive coupling with an ambient alternating electric field according to the Hall effect.

The difference signal is filtered and passed to a microprocessor for signal processing. The microprocessor includes an analog-to-digital converter that converts an input signal to a digital representation for analysis by software in the microprocessor. If analysis of the difference signal indicates the presence of dangerous alternating voltage on a conducting surface in the vicinity of the probe tip, then visual, audible, and tactile alarms are activated to warn a worker using the probe that a dangerous foreign voltage is present on the conductor. In such event, the worker can defer touching or working on the conductor until the source of foreign voltage is located and deactivated. In use, the worker activates the detector with a button on its face and observes a self-test routine to confirm that the detector is functioning properly. The tip of the detector is then moved to the vicinity of a conductor to be serviced by the worker. Detection of a dangerous foreign voltage on the conductor is indicated by an LED bar display, an audible buzzer, and by tactile vibration of the detector.

The microprocessor is programmed to avoid false alarms caused by non-dangerous alternating voltages present on a conductor or by ambient electric fields generated, for example, by distant power lines. For instance, the microprocessor is programmed to ignore input signals from the amplifier at frequencies lower than 35 cycles per second (hertz). Telephone ring signals typically are around 90 volts a/c, which can otherwise cause a false alarm, but are modulated at around 20 hertz and are not considered dangerous. Accordingly, rejection of frequencies below 35 Hz provides infinite rejection of ring signals that might otherwise generate a false alarm.

In an environment where there are nearby high power lines, the electric field generated by the power lines can be extensive. Such an electric field can result in a false indication of a dangerous voltage on a conductor when in fact the cause of the false alarm is distant high power lines. To prevent such false alarms, the two spaced apart sensors of the present invention, when in an electric field caused by distant power lines, will detect substantially the same field strength. Accordingly, no or only a miniscule difference signal is produced by the instrument amplifier and no signal gets passed to the microprocessor for analysis. The result is a very effective rejection of electric fields caused by distant sources that otherwise can produce false alarms.

The invention will be understood better upon review of the detailed description set forth below when taken in conjunction with the accompanying drawing figures, which are briefly described as follows.

DETAILED DESCRIPTION

Figure 1:
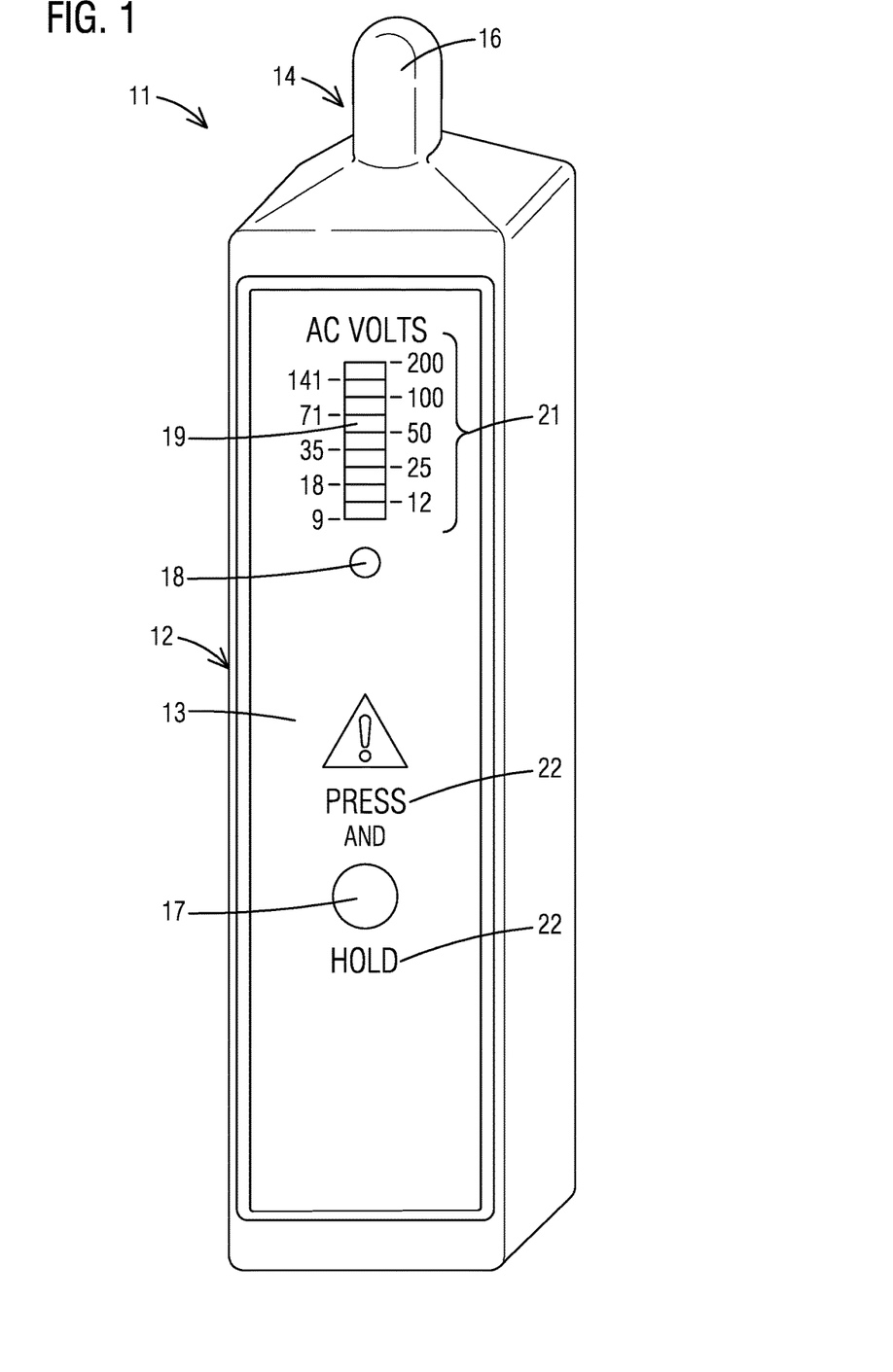
FIG. 1 is a perspective view of a probe for detecting dangerous foreign voltages that embodies principles of the present invention in one preferred form.

Reference will now be made in more detail to the drawing figures, wherein like parts and steps are indicated, where appropriate, with like reference numerals throughout the several views. FIG. 1 shows a probe that embodies principles of the invention in one preferred form. The probe 11 includes a generally rectangular case 12 having a face 13. A cylindrical probe tip 14 projects from one end of the case and terminates in a rounded or dome-shaped end 16. The case 12 and tip 14 house the various electronic circuit components of the foreign voltage detector, as detailed below, as well as a battery for powering the electronic circuits. An activation button 17 is disposed on the face 13 as is a visual battery indicator in the form of a light emitting diode (LED) 18 and a 10 element LED bar graph 19 that lights when a foreign voltage is detected. Indicia 21 indicate the approximate voltage level of a detected foreign voltage. Other indicia, such as indicia 22, provide operating instructions and other information relevant to a user.

In operation, a lineman or other worker removes the probe 11 from a holster and presses and holds the button 17. This initiates an internal self-test indicated by the progressive lighting of the LED bar graph, and brief activation of the audible and tactile alarms. The LED 18 then lights to indicate to the worker that the battery is sufficiently charged for operation. After the initial self-test, the detector enters its detection mode and the worker moves the probe tip to the vicinity of a conductor or conductors that he is to service. If an alternating voltage is present on the conductor, the two spaced apart sensors in the tip 14 become charged through capacitive coupling with the alternating electric field produced by the voltage. This results in small alternating voltage signals on the first sensor and on the second sensor.

The two sensors are coupled by wires to the inputs of an instrument amplifier that is configured as a difference amplifier. The output of the difference amplifier is an alternating signal that is the amplified difference between the alternating voltage signals induced in the first and second sensors. If the difference signal is greater than a predetermined threshold, then the LED bar graph lights appropriately to indicate the presence and approximate magnitude of a foreign voltage. In addition, an internal vibration motor is activated to provide a tactile alarm to the worker and an audio alarm is sounded, all indicating that a potentially dangerous alternating voltage has been detected.

The circuitry in the probe is configured to ignore detected signals below about 35 hertz so that benign telephone ring signals around 20 hertz will not activate a false indication of a dangerous alternating voltage. Furthermore, ambient electric fields of the type that are produced by distant high voltage power lines do not result in a false alarm as has occurred in the past. More specifically, when the probe is immersed in such a long range electric field, the difference in the resulting small alternating voltages induced in the first and second sensors is very small or zero. This is because the electric field produced by distant power lines is substantially uniform in intensity at such a long distance from their source. Accordingly, very little or no difference signal is produced and no foreign voltage alarm is sounded. It will thus be seen that the dual spaced apart sensors in the tip 14 of the detector 11 and the detection methodology of the present invention provide natural rejection of electric fields produced by distant high voltage power lines and other distant sources.

Figure 2:
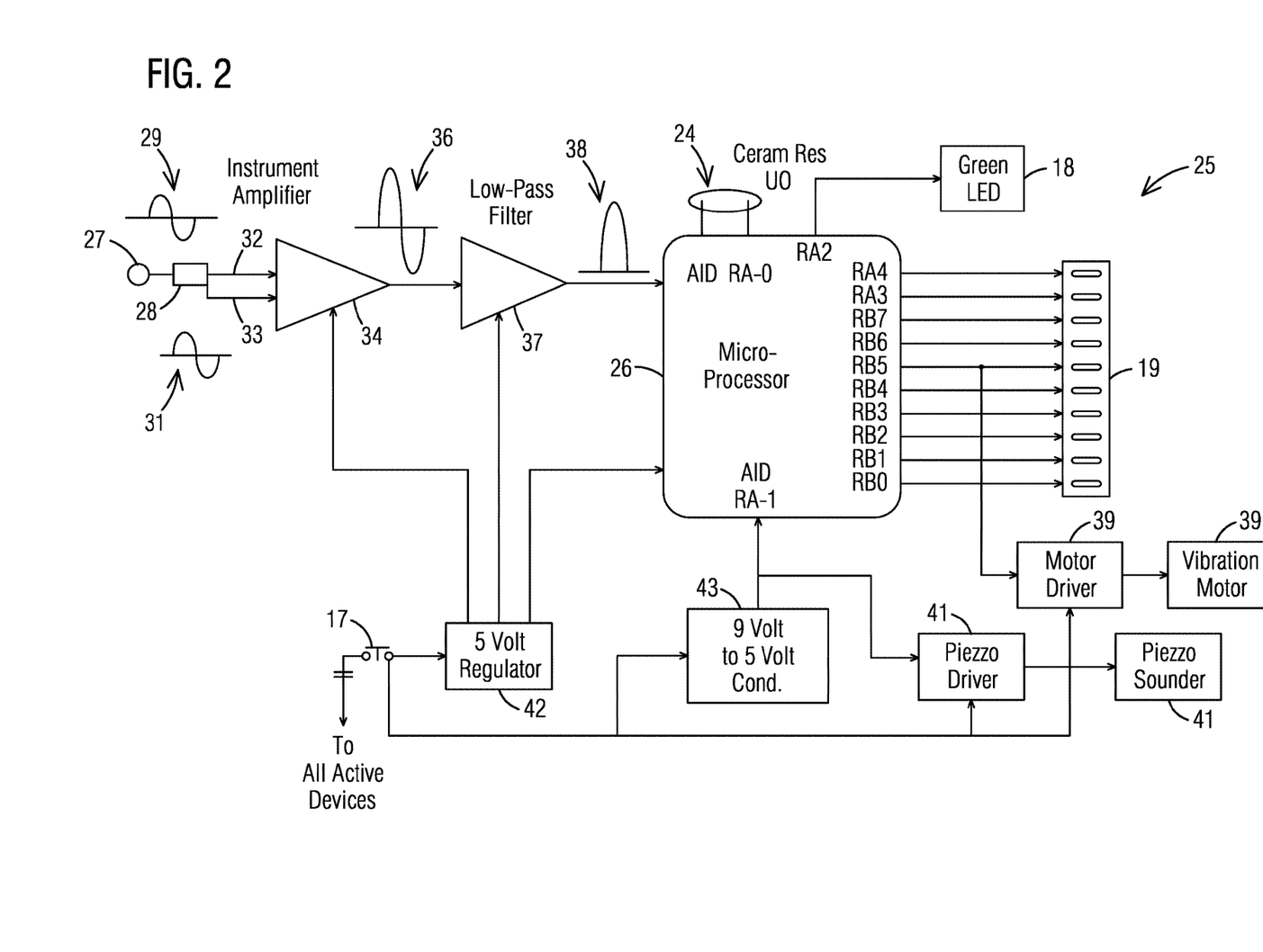
FIG. 2 is a high level schematic diagram of an electronic circuit for carrying out the invention.

FIG. 2 is a functional block diagram of an electronic circuit for carrying out the present invention. The electronic circuit is centered on a microprocessor 26, which is programmed to carry out all functions of the detector. The microprocessor 26 contains an analog-to-digital (A/D) converter and sufficient internal memory to host all needed software. The processor is clocked by an external 4 megahertz ceramic resonator 24, which is internally divided by 4 to set the actual microprocessor speed to 1 megahertz. This yields a very convenient cycle time of the microprocessor of 1 microsecond.

The first sensor, which may be a conductive sphere 27, is contained within the dome-shaped end 16 of the probe tip 14. A second sensor, which may be a conductive cylindrical sleeve, also is contained within the tip 14. The conducting sleeve is spaced a predetermined distance behind the conducting sphere within the tip of the probe. The spacing between the conducting sphere and the conducting sleeve can be between about 0.01 inch and 1.0 inch, but preferably is about 0.15 inch. When placed in the presence of an alternating electric field, the sphere and the sleeve are capacitively coupled to the field so that an alternating voltage proportional to the electric field is induced both on the sphere and the sleeve. For illustration, the conducting sphere 27 may carry an alternating voltage 29 and the conducting sleeve 28 may carry an alternating voltage 31. The alternating voltage 29 carried by the sphere is connected through a wire 32 to one input of an instrument amplifier 34 and the alternating voltage 31 from the sleeve is connected through a wire 33 to the other input of the instrument amplifier.

The instrument amplifier 34 is configured in this case as a difference amplifier such that the output of the instrument amplifier 34 is the amplified difference between the alternating voltages induced on the two sensors. This signal is referred to herein as the difference signal. The differential gain of the instrument amplifier is set by a resistor in order to establish a magnitude of the difference signal that will be appropriate for the A/D converter in the microprocessor 26. The difference signal 36 at the output of the instrument amplifier 34 is connected to the input of an operational amplifier (op amp) or op amp group 37, which is configured as an active low pass filter.

The op amp 37 acts to smooth the amplified difference signal 36, resulting in a clean sine wave. The low pass filter configuration of the op amp group 37 also filters out higher frequency signals that may be induced in the sensing elements by radio waves, microwaves, and other ambient fields, which are not indicators of the presence of a dangerous foreign voltage. The output of the op amp group 37 is routed directly to the A/D converter of the microprocessor. Operating power for the input amplifiers, microprocessor, and bar graph indicator is supplied from a 5 volt regulator 42, which is connected through button 17 to the internal 9 volt battery.

The piezoelectric audible alarm, indicated by reference numeral 41, is driven by a dedicated integrated circuit driver containing two H bridge arrangements powered directly from the internal 9 volt battery. The tactile alarm, indicated by reference numeral 39, is driven by two npn transistors (Q1 and Q2 in FIG. 4), which also are powered directly from the 9 volt battery. Each element of the ten-step LED bar graph is activated through a connection directly to a corresponding port lead of the microprocessor 26. The tactile alarm 39 is activated when the $6^{th}$ bar graph element is activated, which corresponds in the illustrated embodiment with the detection of the presence of about 50 volts. Thus, when a signal indicative of the presence of 50 or more volts is detected by the detector, the corresponding elements of the LED bar graph light and the tactile alarm is activated so that a worker can feel the probe vibrate in his or her hand in addition to the lighting of the bar graph. The audible alarm is created directly by the microprocessor, which uses an on-board timer to set up a square wave with a frequency of about 3,000 hertz.

Figure 3:
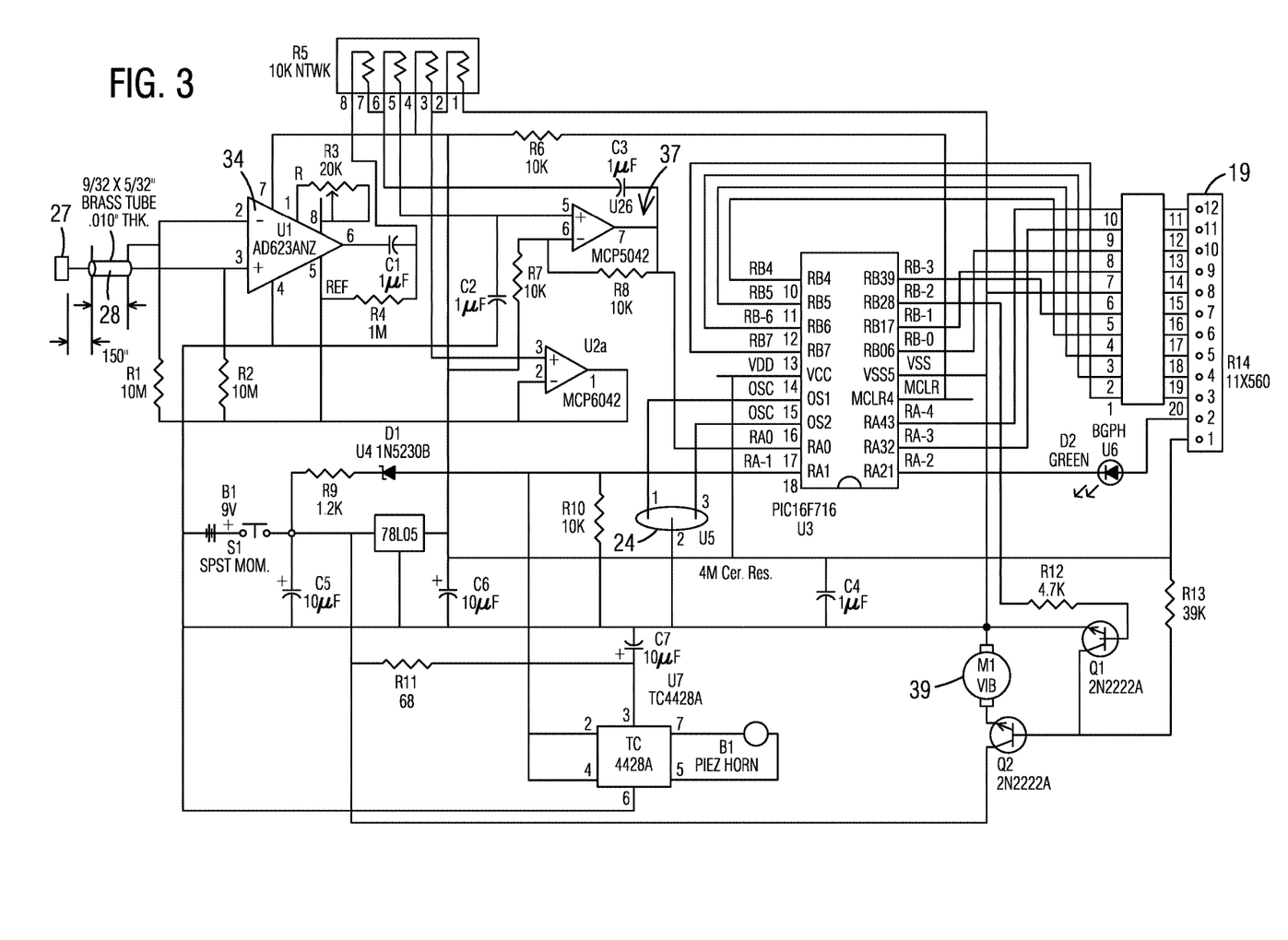
FIG. 3 is a detailed electronic schematic illustrating one example of a circuit capable of carrying out the invention.

FIG. 3 is a detailed schematic showing one possible circuit for carrying out the current invention. Other circuit arrangements are, of course, possible and all such circuits should be considered to fall within the scope of the invention disclosed herein. One of skill in the art having read the forgoing description of FIG. 2 will understand the example circuit of FIG. 3 so that a detailed description of the circuit and its elements is not needed here. However, some of the numbered elements of FIG. 2 also are shown in FIG. 3 for clarity of understanding.

Figure 4:
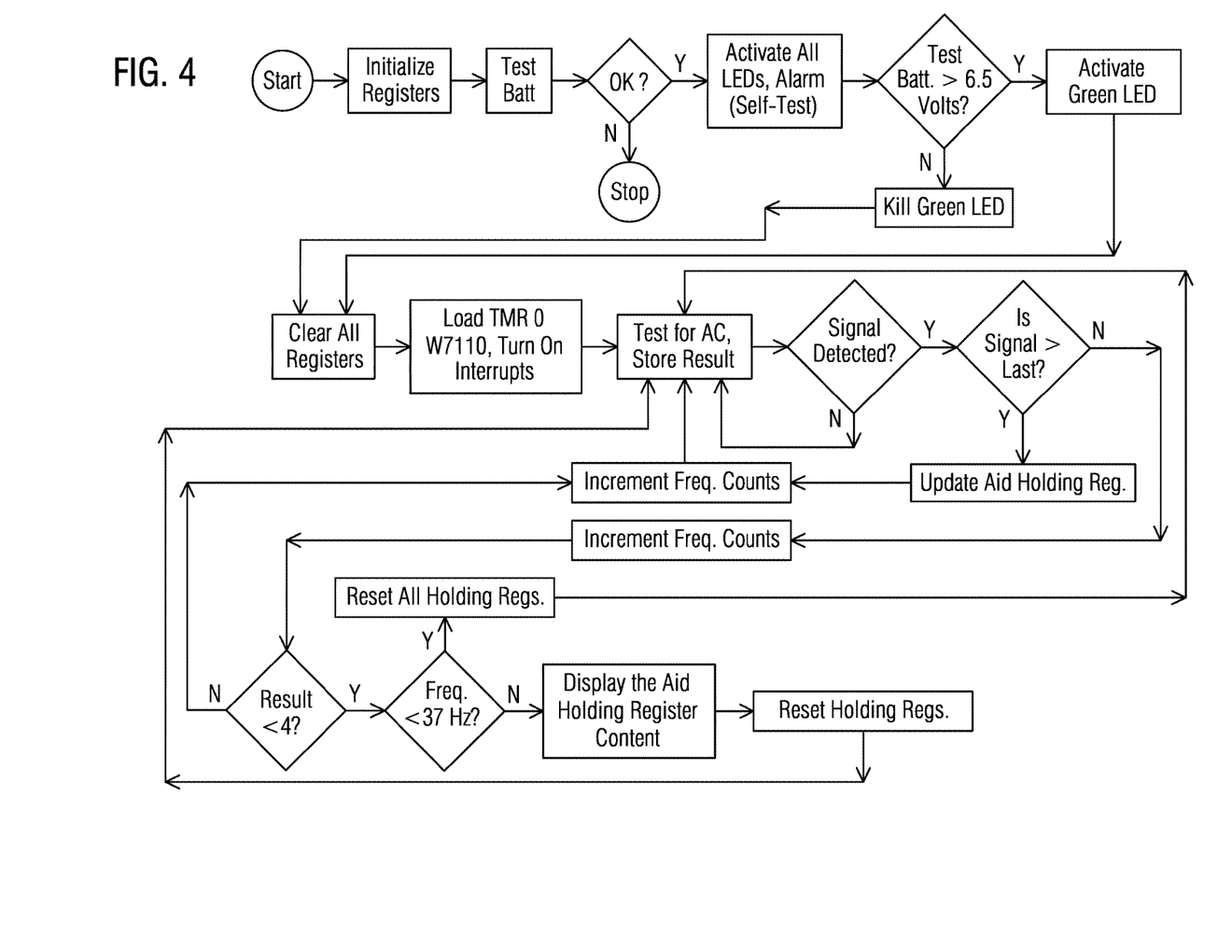
FIG. 4 is a functional flow chart showing one embodiment of the primary methodology of the invention, which preferably is implemented in software.
Figure 5:
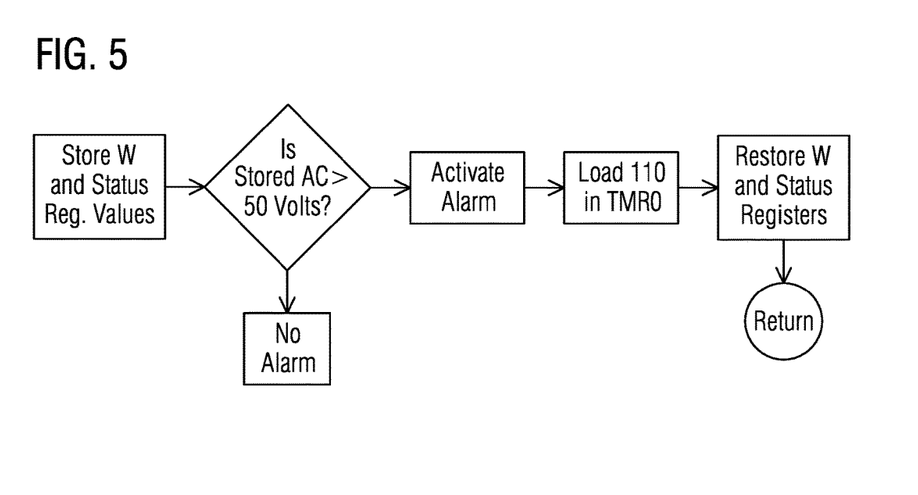
FIG. 5 is a functional flowchart of a routine for activating an alarm when a foreign voltage above 50 volts is detected.

Having described an exemplary electronic circuit for carrying out the invention, one embodiment of software with which the microprocessor 26 may be programmed will now be described in detail with reference to FIGS. 4 and 5. On power up (i.e. when the button 17 is pressed), the processor's registers are initialized and the battery voltage is measured under minimal load. If the battery voltage under minimal load is below a predetermined threshold, which may be about 6.5 volts, the processor simply stops and the detector will not work. If the battery passes this initial test, a self-test is performed to test all visible indicators and alarms. This test is accomplished by loading a value in the A/D holding register of the microprocessor and calling the display routine. Values are loaded to activate each bar graph step from bottom to top with a 200 millisecond dwell time at each level. When the sixth element of the LED bar graph is lit, indicating greater than 50 volts, the audible and tactile alarms activate confirming their proper operation.

When all ten elements of the LED bar graph are activated and with the audible and tactile alarms active, the battery is under maximum load and another battery test is made. If the battery passes this max load test (i.e. continues to exhibit more than 6.5 volts under load), then the visual indicator 18 is turned on, indicating that the battery is adequately charged for operation. If the battery fails the max load test, the program continues with the visual indicator light not active (i.e. turned off), indicating that the battery needs to be replaced. If the battery passes, then the self-test is complete, the lights and alarms are turned off, and the probe enters its detection mode and is ready for use.

Following the self-test, holding registers of the microprocessor are cleared, the internal A/D converter is set to measure the amplified detected voltage, timer 0 is loaded with 110 (decimal) and interrupts of the microprocessor are activated. A/D converter measurement routine is then called and the signal at the output of the low pass filter 37 is measured and digitized. The result is then evaluated to determine whether a signal was detected and if it was greater than a threshold value stored in the A/D converter's holding register. If the A/D measurement result is less than 4, the measurement is repeated until a measurement greater than 4 is detected. A reading of less than 4 is considered either noise or the negative portion of an alternating difference signal and thus is ignored so that it does not trigger an alarm.

When a signal above the threshold is detected, it is compared with the value in the holding register from the immediately previous measurement. If the detected signal is greater than the stored value, the holding register is updated with the detected value, the frequency register is incremented, and the measurement repeated. If the new value is less than the now stored value, the frequency register is incremented and the measurement is repeated until the level of the detected signal drops below the noise threshold of 4. A level of 4 is considered zero crossing of the detected alternating difference signal.

At this point the value in the A/D holding register represents the peak value of the amplified difference signal. Counts stored in the frequency register are then evaluated to see if they indicate that the frequency of the detected signal is below 35 hertz. This process is described in more detail below. If the frequency is below 35 hertz, the holding register of the A/D converter and the frequency register are cleared and the measurement loop is resumed. If the frequency is greater than 35 hertz the display routine is called, which will activate the elements of the LED bar graph to indicate the approximate RMS voltage on the conductor being tested that corresponds to the alternating digitized difference signal. Following the voltage display, A/D and frequency holding registers are cleared, A/D measurement is called, and the entire process is repeated.

Determination of the frequency of the alternating difference signal as described above can be done in the following way. The frequency holding register will indicate approximately 120 incremental counts for a 60 hertz signal. On the other hand, a 35 hertz signal will result in about 200 incremental counts in the frequency holding register. So the software subtracts 200 from the stored counts in the frequency register and checks for a positive or a negative result. Any signal with counts above 200 corresponds to a signal with a frequency less than 35 hertz and is simply ignored.

Since telephone ring signals are about 90 volts at about 20 hertz, the technique implemented in the software provides infinite rejection to telephone ring signals, which could otherwise cause many false alarms.

In the methodology described above, the positive side of each cycle of an alternating difference signal is repeatedly sampled and the highest level sampled ends up being stored in the A/D converter register. The sampling of the difference signal continues as the alternating difference signal declines to the zero crossing point. All evaluations of the sampled data and frequency register are then made during the negative portion of the cycle of the difference signal. For 60 hertz signals, approximately 60 samples will be collected and used each cycle to update the A/D holding register during the rising portion of the difference signal from zero crossing to peak. The A/D holding register will not be updated during the subsequent falling portion of the signal because successive samples will always be less than their immediately preceding samples. However, the frequency register continues to be incremented for each sampling cycle. Again, the result is a value in the A/D holding register indicative of the value of the peak of a detected signal and a value in the frequency register indicative of the frequency of the detected signal.

Two internal timers of the microprocessor are used during the interrupt service routine when appropriate alarms are to be activated. Timer 0 is used to derive the 3,000 hertz frequency signal needed to drive the audio alarm. Timer 1 is set to interrupt the 3,000 hertz signal with a 65 millisecond period. When timer 0 interrupts, the routine checks to see if the stored level indicates the presence of a voltage greater than 50 volts. If less than 50 volts is indicated, the routine resets 110 (decimal) into timer 0 and returns. If the level indicates greater than 50 volts, the port lead for audible alarm is either set or reset, depending on its current condition (if set, clear it, if clear, set it). The result of this is to generate an audio alarm signal that is a 3,000 hertz square wave. When timer 1 interrupts, the alarm signal is turned on or off depending on its present condition (if on, turn it off, if off, turn it on). This gives the audible alarm a harsher sounding stutter effect, which attracts the attention of a worker better.

At the beginning of a call to the interrupt routine, the working and status register contents are stored, then just before returning from interrupt routine both registers are reloaded with their values at the beginning. This allows the program to resume after return from a call to the interrupt routine with these registers loaded with the values they contained when the interrupt routine was called.

Figure 6:
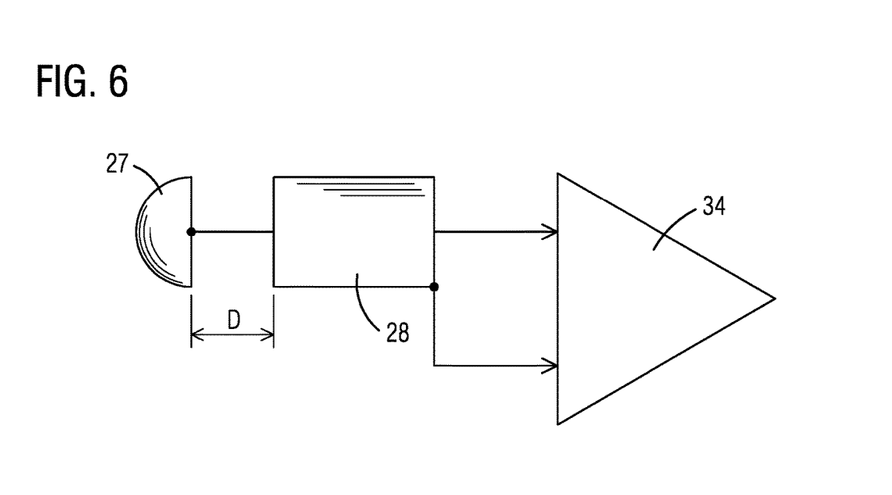
FIG. 6 illustrates an enhanced configuration of the first sensor and the second sensor for enhanced performance.

FIG. 6 illustrates an enhanced configuration of the first sensor 27 and the second sensor 28 that has been discovered through experimentation to provide enhance performance of the detector. Specifically, the first sensor 27 in this enhancement is not a conducting sphere but rather a conducting hemispherical shell connected to the instrument amplifier 34. While a hemispherical shell is the preferred shape of the first sensor 27, other spheroid shapes also may be used and the invention is intended to encompass these shapes as well. For instance, the first sensor 27 may be a conducting partial hemisphere, a parabolic shell, a dome-shaped shell, or any other truncated curved or spheroidal shape and it is expected that similar functional enhancements will result.

It has further been discovered through experimentation that the distance D between the truncated end of the spheroidal shell and the end of the second sensor 28, which remains a conducting sleeve or other tubular shape, is important to optimum operation of the detector. More specifically, the distance D preferably is between about 80 mils and 120 mils, more preferably between about 90 mils and about 110 mils, and most preferably 100 mils. Such spacing when combined with the configurations of the sensors 27 and 28 of FIG. 6, have proven to optimize the ability of the detector to reject distant sources of electric fields from proximate sources of such fields.

The invention has been described herein in terms of preferred embodiments and methodologies considered by the inventors to represent the best mode of carrying out the invention. It will be understood by one of skill in the art, however, that the illustrated embodiments and methodologies are provided as examples only and are not intended to be limiting. A wide range of additions, deletions, and modifications, both subtle and gross, might well be made to the illustrated embodiments without departing from the spirit and scope of the invention, which is delineated only by the claims hereof.

What is claimed is:

1. A method of detecting the presence of a hazardous alternating current foreign voltage on a conductor, the method comprising the steps of:
   (a) sensing an alternating electric field in the vicinity of the conductor with a first non-contact conductive sensor having a generally truncated spheroidal shape;
   (b) sensing the alternating electric field in the vicinity of the conductor with a second non-contact conductive sensor spaced a predetermined distance from the first non-contact conductive sensor and being shaped as a sleeve;
   (c) generating an alternating difference signal that is proportional to the difference between the alternating electric field sensed by the first conductive sensor and the alternating electric field sensed by the second conductive sensor;
   (d) when the alternating difference signal generated in step (c) exhibits a peak that is less than a predetermined threshold, considering the electric filed sensed by the first and second conductive sensors not to be indicative of the presence of a foreign voltage on the conductor and ignoring the difference signal generated in step (c);
   (e) when the alternating difference signal generated in step (c) exhibits a peak that is greater than a predetermined threshold, considering the electric field sensed by the first and second conductive sensors to be indicative of the presence of a foreign voltage on the conductor; and
   (f) activating at least one alarm if the presence of a foreign voltage on the conductor is indicated in step (e).

2. The method of claim 1 wherein the predetermined distance in step (b) is between about 80 mils and about 120 mils.

3. The method of claim 2 wherein the predetermined distance in step (b) is 100 mils.

4. The method of claim 1 further comprising determining a frequency of the difference signal generated in step (c) and ignoring difference signals below a predetermined threshold frequency.

5. The method of claim 4 wherein the predetermined frequency is about 35 hertz.

6. The method of claim 1 further comprising filtering the alternating difference signal generated in step (c) with a low pass filter to remove components of the alternating difference signal above a predetermined frequency.

7. The method of claim 6 wherein the predetermined frequency corresponds to radio wave and microwave frequencies.

8. The method of claim 1 wherein step (d) comprises repeatedly sampling the difference signal, storing the highest value sampled, storing a zero crossing value sampled, and subtracting the highest value from the zero crossing value to determine the peak of the difference signal.

9. The method of claim 8 wherein the zero crossing value is determined when a sample of the difference signal falls below a predetermined threshold.

10. The method of claim 9 wherein the predetermined threshold is about 4.

11. The method of claim 1 wherein step (f) comprises activating a bar graph indicator to display the approximate magnitude of the sensed alternating foreign voltage.

12. The method of claim 11 wherein the bar graph indicator is an LED bar graph.

13. The method of claim 12 wherein step (f) comprises activating an audible alarm.

14. The method of claim 13 wherein step (f) comprises activating a tactile alarm.

* * * * *